United States Patent [19]

Hatori et al.

[11] Patent Number: 5,329,331
[45] Date of Patent: Jul. 12, 1994

[54] POST-PROCESSING APPARATUS WITH SOLUTION'S TEMPERATURE DETECTOR

[75] Inventors: Nobuyoshi Hatori; Toshio Koike, both of Tokyo, Japan

[73] Assignee: Iwatsu Electric Co., Ltd., Tokyo, Japan

[21] Appl. No.: 5,398

[22] Filed: Jan. 15, 1993

[30] Foreign Application Priority Data

Jan. 17, 1992 [JP] Japan .................... 4-005431

[51] Int. Cl.$^5$ .................... G03D 13/00; G03D 5/04
[52] U.S. Cl. .................... 354/299; 354/325
[58] Field of Search ............... 354/299, 324, 325, 317

[56] References Cited

U.S. PATENT DOCUMENTS

| | | | |
|---|---|---|---|
| 4,240,737 | 12/1980 | Lawson | 354/299 |
| 4,421,399 | 12/1983 | Steube | 354/299 |
| 4,652,106 | 3/1987 | Jurgensen et al. | 354/325 |
| 5,055,870 | 10/1991 | Ohba et al. | 354/325 X |
| 5,196,878 | 3/1993 | Muller et al. | 354/299 |
| 5,210,005 | 5/1993 | Takekoshi et al. | 354/325 X |

Primary Examiner—Fred L. Braun
Attorney, Agent, or Firm—Oblon, Spivak, McClelland, Maier & Neustadt

[57] ABSTRACT

A post-processing apparatus for washing off a photosensitive layer in a non-image area of an organic photoconductive master plate that has been prepared on a platemaker through the steps of exposure, development and fixing. The apparatus including a swelling/wetting section for rendering the photosensitive layer in the non-image area swollen and wet; a stripping section for stripping and removing the photosensitive layer; a cleaning section for washing the photosensitive layer with water; solution receiving tanks provided for the respective sections for receiving processing solution; spray pipes provided along a width of the master plate for spraying the processing solution from the solution receiving tanks respectively associated with the swelling/wetting, the stripping and the cleaning sections; and a detector for detecting a temperature of the processing solution. The detector being provided in a rear end of a fluid passageway of the spray pipe in the swelling/wetting section. The apparatus further including an outlet for injecting the processing solution toward the master plate, the outlet being bored in a wall of the rear end portion of the spray pipe facing with a temperature sensing head of the detector; a heater for the processing solution being provided in the solution receiving tank of the swelling/wetting section; and a controller for controlling the heater according to an output signal from the detector.

4 Claims, 2 Drawing Sheets

POST-PROCESSING APPARATUS WITH SOLUTION'S TEMPERATURE DETECTOR

BACKGROUND OF THE INVENTION

Field of the Invention

This invention relates to a post-processing apparatus with a detector for detecting a solution's temperature, by which a photosensitive layer in a non-image area of an organic photoconductive master plate that has been prepared on a platemaker through the steps of exposure, development and fixing is washed off to prepare a master plate having an image of printing quality formed thereon.

When preparing masters with image of printing quality formed by means of conventional platemakers, a sheet of zinc oxide master (hereinafter abbreviated as "ZnO master") or an organic photoconductive master plate using an aluminum substrate (hereinafter abbreviated as "OPC master plate") is selected depending upon various conditions such as the mode of printing, the number of prints and the method of paper feed; after charging for each master, the master is transported to an exposure stage where a latent image of the original is formed; then, the master is sent to a delivery transport unit where the original image is rendered visible (developed) and fixed before it emerges on a delivery tray.

In the case of a ZnO master, the one which has just been processed on the platemaker is sent as such to a printing machine. However, in the case of an OPC master plate using an aluminum substrate, the processed plate is transported to a post-processing apparatus where the photosensitive layer in the non-image area of the master is washed off by spraying a processing solution controlled at an appropriate temperature, thus yielding a master plate on which a desired image of printing quality has been formed. Since the processing solution for washing off the photosensitive layer in the non-image area requires very strict temperature control, the master plate just processed on the platemaker is first sent to the post-processing apparatus where the spray of a temperature-controlled processing solution is applied to the photosensitive layer in the non-image area, so that it becomes sufficiently swollen and wet to be stripped and washed off.

The conventional post-processing apparatus for OPC master plates has only a temperature sensing device submerged in the tank of processing solution. If the tank has a large capacity, a temperature variation occurs to the processing solution depending on the specific site of measurement, thereby making it extremely difficult to ensure that the temperature of the processing solution is strictly held closely at constant level throughout the interior of the tank. As a consequence, temperature fluctuations occur while the processing solution is sprayed and the resulting failure to achieve positive stripping and washing-off of the photosensitive layer in the non-image area has made it impossible to prepare a master plate on which an image of good quality has been formed.

SUMMARY OF THE INVENTION

The present invention has been accomplished under these circumstances, and an object of the present invention is to provide a post-processing apparatus with a detector for detecting a temperature of a processing solution, by means of which the temperature of the processing solution being sprayed in the post-processing apparatus is measured and controlled appropriately, so that the temperature of the solution which performs post-processing on an organic photoconductive master plate can be held constant.

This object of the present invention can be attained by provision of a post-processing apparatus with a detector for detection of the solution's temperature by which the photosensitive layer in the non-image area of an organic photoconductive master plate that has been prepared on a platemaker through the steps of exposure, development and fixing is washed off to prepare a master plate having image formed for printing, characterized in that the post-processing apparatus comprises a swelling/wetting zone for rendering the photosensitive layer in the non-image area swollen and wet, a stripping zone for stripping and removing the photosensitive layer and a cleaning zone for washing the photosensitive layer with water, spray pipes being provided along the width of the master plate for spraying the processing solution from solution-receiving tanks respectively associated with the swelling/wetting zone, the stripping zone and the cleaning zone, a temperature detecting device with a temperature sensing head being provided in the rear end portion of the fluid passageway of at least one of the spray pipes through which the processing solution is to be sprayed from the swelling/wetting zone, and an outlet for injecting the processing solution being bored in the wall of the rear end portion of the spray pipe which is faced with the temperature sensing head of the temperature detecting device.

When a master having of printing quality formed thereon is to be prepared with the post-processing apparatus of the present invention by washing off the photosensitive layer in the non-image area of the surface of an organic photoconductive master plate using an aluminum substrate that has been prepared on a platemaker through the steps of exposure, development and fixing, the temperature of the processing solution being sprayed in the post-processing apparatus is measured directly and controlled in such a way as to hold the temperature of the solution at a constant level.

DETAILED DESCRIPTION OF THE PREFERRED EMBODIMENTS

An embodiment of the present invention is described below with reference to the accompanying drawings.

Figure 1:
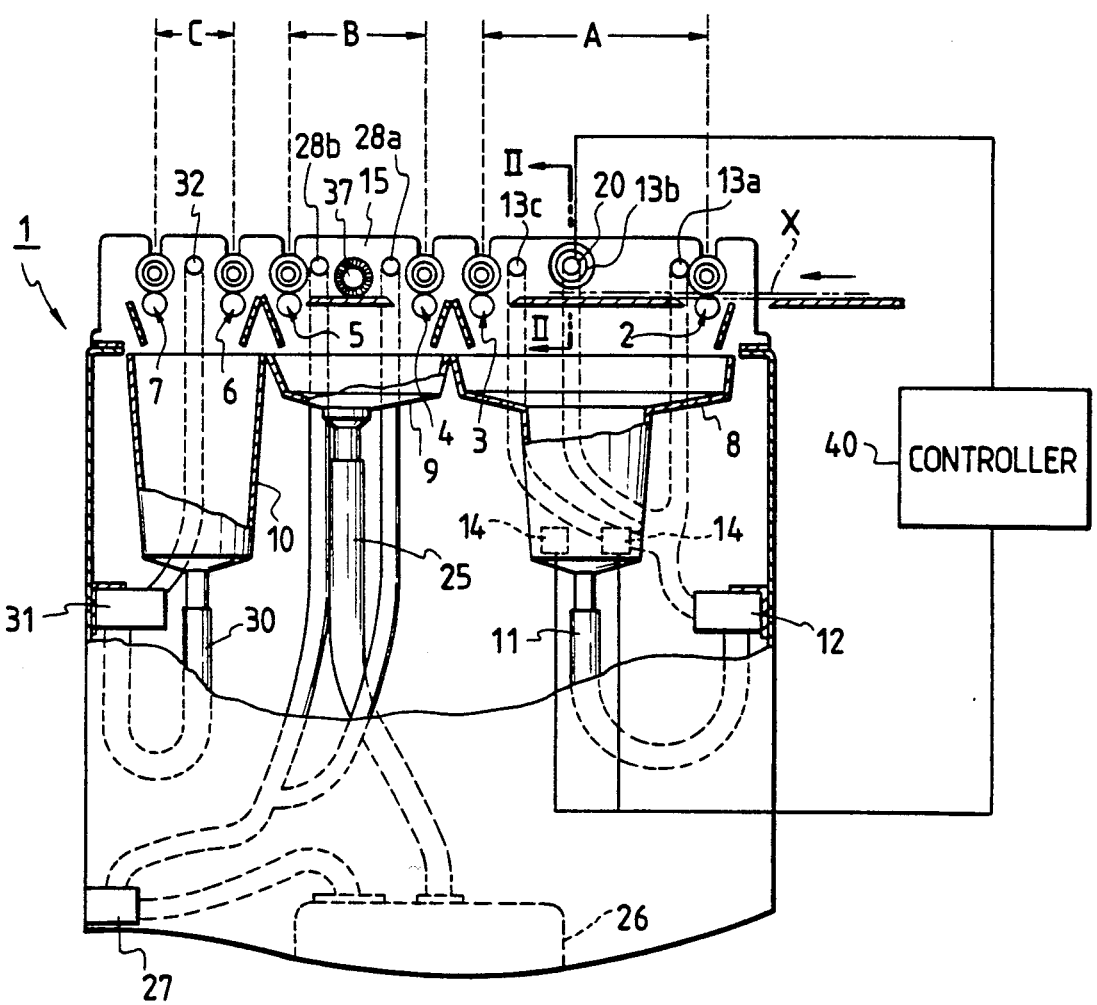
FIG. 1 is a schematic diagram showing, with part taken away, a post-processing apparatus according to an embodiment of the present invention.

FIG. 1 is a schematic diagram showing, with part taken away, a post-processing apparatus according to an embodiment of the present invention. A post-processing apparatus 1 generally comprises the following three zones that are arranged in a direction in which a master plate X is transported at a given speed: swelling/wetting zone A in which the surface of the master plate is sprayed with a processing solution so that the photosensitive layer in the non-image area of the plate surface will swell and wet sufficiently to be readily strippable; stripping zone B for stripping and removing the swollen and wetted photosensitive layer in the non-image area; and cleaning zone C for finishing the surface of the master plate by washing with water.

Transport roller pairs 2, 4 and 6 are provided at the entrances to the swelling/wetting zone A, stripping zone B and washing zone C, respectively, whereas similar roller pairs 3, 5 and 7 are provided at the exits from the respective zones. Each roller pair consists of a driver and follower that hold between them the opposite end portions of the master X in the direction of travel. Below the zones A, B and C are respectively provided solution receiving tanks 8, 9 and 10 of predetermined capacities that are each filled with a predetermined processing solution.

A pipe 11 is connected at one end thereof to the bottom of the tank 8 below the swelling/wetting zone A. The other end of the pipe is connected to a pump 12, from which it emerges in multiple branches that are directed to spray pipes 13a, 13b and 13c positioned above the master plate X. Those spray pipes extend along the width of the master plate X and are arranged in such a way that the processing solution is sprayed uniformly over the entire surface of the plate. Since the processing solution with which the tank 8 below the swelling/wetting zone A is filled requires strict temperature control, it is necessary to keep the solution at a constant temperature at all times. To meet this need, heaters 14 are provided within the tank 8. The heaters 14 have to be temperature-controlled by detecting the temperature of the processing solution being injected through the spray pipes 13a, 13b and 13c. Hence, the spray pipe 13b is fitted with a solution's temperature detector 20 for detecting directly the temperature of the processing solution being injected. A controller 40 is provided so as to control the heaters 14 in response to the temperature of the processing solution detected by the detector 20.

Figure 2:
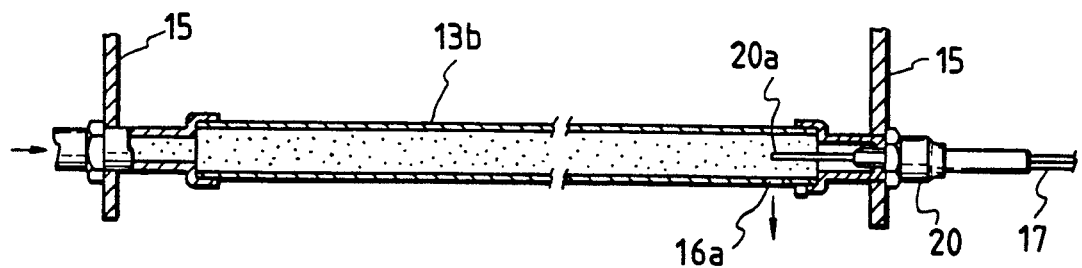
FIG. 2 is a cross section of the pipe for spraying a processing solution from the swelling/wetting zone, taken from the line II—II in FIG. 1.
Figure 3:
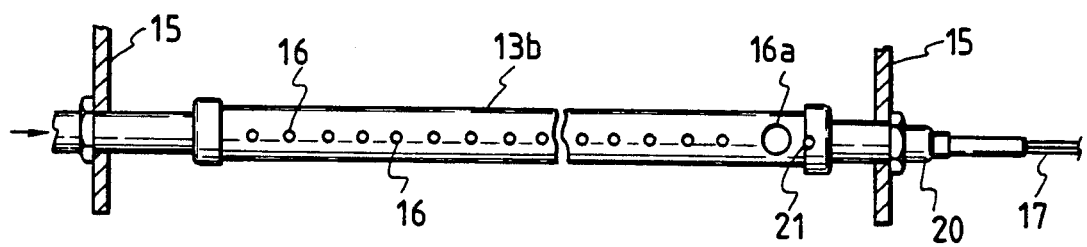
FIG. 3 is a bottom view of the pipe shown in FIG. 2.

As shown in FIGS. 2 and 3, the spray pipe 13b is supported by a frame 15 at both ends. The processing solution entering the pipe from the left side as indicated by an arrow is injected through a row of spouts 16 formed in the sidewall of the pipe 13b at the point facing the master plate X, whereby the solution is sprayed uniformly over the entire surface of the plate. At the same time, the temperature of the processing solution being injected is detected by means of the solution's temperature detector 20 provided in the rear end portion of the spray pipe 13b in the direction of fluid passage. The detector 20 is composed of a temperature sensing device such as a thermistor, and provided with a temperature sensing head 20a which extends to the rear end portion of the spray pipe 13b and a fluid outlet 16a through which part of the processing solution can flow out is bored in the wall of the pipe at the point that is faced with the head 20a. Shown by reference numeral 17 in FIGS. 2 and 3 is a lead wire connected to the detector 20, and reference numeral. 21 is a knock pin that positions the spray pipe 13b in such a way that the spouts 16 will face just downward when the pipe is hooked up on the frames 15.

Referring back to FIG. 1, a pipe 25 is connected at one end thereof to the bottom of the tank 9 below the stripping zone B. The other end of the pipe 25 communicates with the interior of a tank 26 and further to a pump 27, from which it emerges in multiple branches that are directed to spray pipes 28a and 28b positioned above the master plate X. These pipes 28a and 28b extend along the width of the plate and are arranged in such a way that the processing solution, after passing through the tank 26, is sprayed uniformly over the entire surface of the master plate X.

A pipe 30 is connected at one end thereof to the bottom of the tank 10 below the cleaning zone C. The other end of the pipe 30 is connected to a pump 31, from which it emerges to be directed to a spray pipe 32 positioned above the master plate X in such a way that the cleaning solution in the tank 10 is sprayed uniformly over the entire surface of the master plate X.

Figure 4:
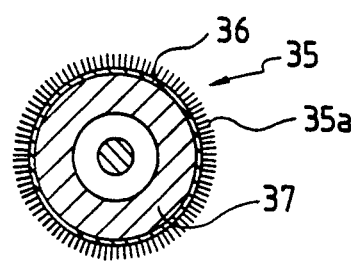
FIG. 4 is a perspective view showing, with part taken away, a brush used in accordance with the present invention.

A drive pipe 37 is provided in the stripping zone B and, as shown in FIG. 4, a brush 35 is attached to the periphery of the drive pipe 37. The brush 35 may be prepared in the following manner: first, a multiple of polymer (e.g. polypropylene) filaments are twisted to form yarns 35a of a predetermined thickness, which are then woven into a pile; the pile is severed to form a strip of pile fabric 36, which is wrapped spirally around the drive pipe 37 and bonded thereto. Being formed in this way, the bristles of the brush 35 are highly flexible and capable of wiping the swollen and wet surface of the master plate X to strip and remove any residual substrate and binder without damaging the plate surface.

The processing solution used to wash off the photosensitive layer in the non-image area requires very strict temperature control. However, the solution's temperature detector 20 of the post-processing apparatus 21 according to the embodiment under consideration which has the structure described in the preceding paragraphs is capable of keeping the temperature of the processing solution at a constant level through control that is performed on the basis of the results of measurement of the temperature of the processing solution which is sprayed in the post-processing apparatus; as a consequence, a master plate having image of excellent printing quality formed thereon can be prepared.

When a master plate that has image of printing quality formed thereon is to be prepared with a post-processing apparatus by washing off the photosensitive layer in the non-image area of the surface of an organic photoconductive master plate using an aluminum substrate that has been prepared on a platemaker through the steps of exposure, development and fixing, the processing solution used in the post-processing apparatus requires very strict temperature control. The structure of the solution's temperature detecting unit according to the present invention is capable of keeping the temperature of the processing solution constant by control that is performed on the basis of direct measurements of the processing solution being sprayed in the post-processing apparatus; hence, the temperature control of the processing solution can be easily accomplished to prepare a master plate having image of excellent printing quality formed thereon.

What is claimed is:

1. A post-processing apparatus in which a photosensitive layer in a non-image area of an organic photoconductive master plate that has been prepared on a platemaker through the steps of exposure, development and fixing is washed off to prepare a master plate having image of printing quality formed thereon, said apparatus comprising:

a swelling/wetting section for rendering said photosensitive layer in said non-image area swollen and wet;

a stripping section for stripping and removing said photosensitive layer;

a cleaning section for washing said photosensitive layer with water;

solution receiving tanks for receiving processing solution respectively in association with said swelling/wetting section, said stripping section, and said cleaning section;

spray pipes provided along a width of said master plate for spraying said processing solution from said solution receiving tanks respectively associated with said swelling/wetting section, said stripping section and said cleaning section;

detection means for detecting a temperature of said processing solution, said detection means including a temperature sensing head which is provided in a rear end portion of a fluid passageway of said spray pipe through which said processing solution is to be sprayed from said swelling/wetting section;

an outlet for injecting said processing solution toward said master plate, said detection means being positioned at said outlet so as to detect a temperature of said processing solution as the processing solution is injected toward said master plate, said outlet being bored in a wall of said rear end portion of said spray pipe which is faced with said temperature sensing head of said detection means;

heater means for heating said processing solution, said heater means being provided in said solution receiving tank of said swelling/wetting section; and control means for controlling said heater means according to an output signal from said detection means to keep the temperature of said processing solution constant.

2. An apparatus as claimed in claim 1, in which each of said spray pipes includes a row of spouts in a side wall thereof at a position facing said master plate, through which said processing solution is injected toward said master plate.

3. An apparatus as claimed in claim 2, further comprising a knock pin for positioning said spray pipe so that said row of spouts are faced with said master plate.

4. An apparatus as claimed in claim 1, further comprising a drive pipe provided in said stripping section, said drive pipe having a brush on a periphery thereof for wiping a surface of said master plate, which has been swollen and wet by said swelling/wetting section to strip and remove residual substrate and binder from a surface of the master plate without damaging the surface.

* * * * *